(12) United States Patent
Lin et al.

(10) Patent No.: US 7,755,218 B2
(45) Date of Patent: Jul. 13, 2010

(54) CAPACITIVE TOUCH SWITCH AND CONTROL DEVICE

(75) Inventors: Shi-Quan Lin, Shenzhen (CN); Bin-Gang Duan, Shenzhen (CN); Han-Che Wang, Shenzhen (CN)

(73) Assignees: Ensky Technology (Shenzhen) Co., Ltd., Baoan District, Shenzhen, Guangdong Province (CN); Ensky Technology Co., Ltd., Pan Chiao, Taipei Hsien (TW)

( * ) Notice: Subject to any disclaimer, the term of this patent is extended or adjusted under 35 U.S.C. 154(b) by 506 days.

(21) Appl. No.: 11/849,350

(22) Filed: Sep. 3, 2007

(65) Prior Publication Data

US 2008/0116050 A1 May 22, 2008

(30) Foreign Application Priority Data

Nov. 20, 2006 (CH) .......................... 2006 1 0201123

(51) Int. Cl.
*H01H 35/00* (2006.01)
*H01H 83/00* (2006.01)
(52) U.S. Cl. ..................................... 307/116
(58) Field of Classification Search ............. 307/112, 307/113, 116
See application file for complete search history.

(56) References Cited

U.S. PATENT DOCUMENTS

2006/0145539 A1   7/2006   Muller

*Primary Examiner*—Albert W Paladini
*Assistant Examiner*—Carlos Amaya
(74) *Attorney, Agent, or Firm*—Winston Hsu

(57) ABSTRACT

A capacitive touch switch and control device is provided. The capacitive touch switch and control device in one embodiment includes one or more capacitive sensor elements, one or more resistors, a capacitor, a capacitance/frequency converter, and an antenna including a positive branch and a negative branch. The positive branch and the negative branch synchronously and correspondingly receive a pair of signals from the microprocessor, the pair of signals each undergoing a 180 degree phase shift relative to the other, for shielding the noise acted on the capacitive sensor elements. When any of the capacitive sensor elements is touched, the capacitance/frequency converter outputs a frequency signal to the microprocessor, the microprocessor outputs a control signal that corresponds to the frequency signal to an electronic device to trigger corresponding operations of the electronic device.

9 Claims, 5 Drawing Sheets

| Frequency Value | Control Signal |
|---|---|
| F0 | X0 |
| F1 | X1 |
| F2 | X2 |
| F3 | X3 |
| …… | …… |
| Fn | Xn |

Fig.3

CAPACITIVE TOUCH SWITCH AND CONTROL DEVICE

BACKGROUND OF THE INVENTION

1. Field of the Invention

The present invention relates to an electronic switching device, and particularly to a capacitive touch switch and a control device.

2. Description of Related Art

Most electronic devices have a plurality of switches, the working status of the electronic devices can be changed by the switches. Common mechanical switches operate by electrically connecting two contacts of the switch with a pole, thus, forming a closed circuit for current flowing. However, mechanical switches are subject to wear and tear, and, eventual failure. As a solution for the shortcomings encountered with mechanical switches, capacitive touch switches have been introduced. Capacitive touch switch are well known means for providing inputs to various devices including home appliances such as kitchen electronic devices which have touch pad devices arranged in a keyboard style array. One advantage of the capacitive touch switch is that it isolates the user from system control and voltages.

The United States Patent Application Publication No. 20060145539, entitled "Circuit Configuration For A Capacitive Touch Switch" discloses a circuit configuration for a capacitive touch switch. This capacitive touch switch contains at least one sensor circuit with a capacitive sensor element that changes its capacitance value when touched, and an evaluation circuit that is supplied with an output signal from the sensor circuit in order to determine whether the capacitive sensor element has been actuated or not. However, the sensor circuitries are relatively complicated and are not designed to effectively eliminate electronic noise from other nearby electronic instruments.

SUMMARY OF INVENTION

A capacitive touch switch and control device includes one or more capacitive sensor elements, one or more resistors, a capacitor, a capacitance/frequency converter and a microprocessor. The capacitance/frequency converter has an input terminal and an output terminal. The capacitor is connected to the input terminal of the capacitance/frequency converter. The resistors are connected in series between the input terminal and the output terminal of the capacitance/frequency converter. The capacitive sensor elements are separated from each other by the resistors. The capacitive touch switch and control device further includes an antenna connected to the microprocessor for receiving a pair of signals outputted by a microprocessor. The pair of signals each undergoes a 180-degree phase shift relative to the other and are correspondingly transmitted to the positive branch and the negative branch, thereby shielding the noise acted on the capacitive sensor elements. When any of the capacitive sensor elements is touched, the capacitance/frequency converter outputs a frequency signal to the microprocessor, the microprocessor outputs a control signal that corresponds to the frequency signal to an electronic device to trigger corresponding operations of the electronic device.

BRIEF DESCRIPTION OF DRAWINGS

FIG. 3 shows a frequency value-control signal look-up table of the capacitive touch switch and control device;

DETAILED DESCRIPTION OF THE EMBODIMENTS

Figure 1:
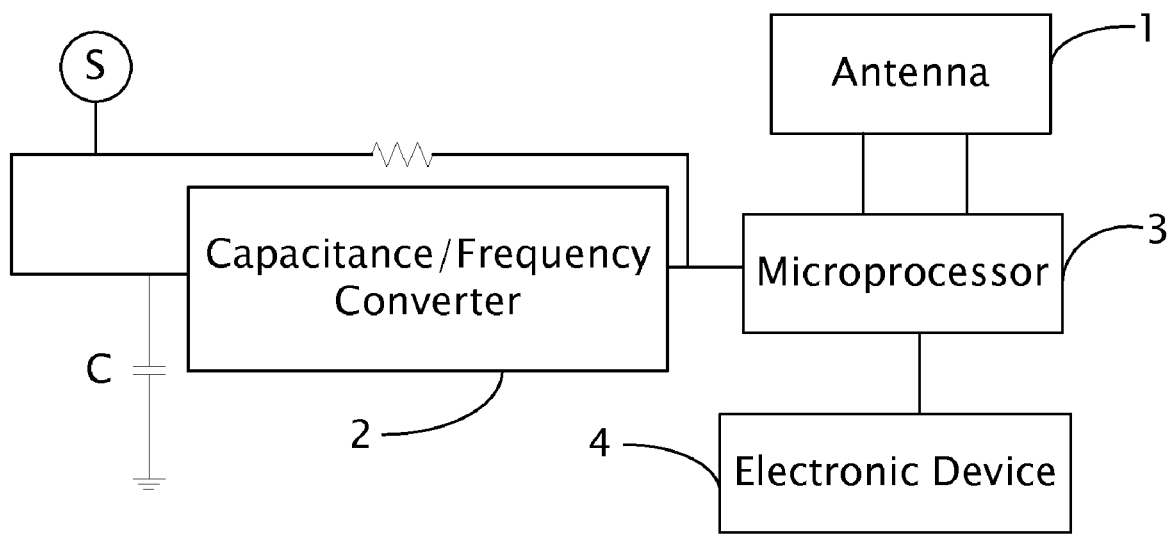
FIG. 1 is a schematic diagram of a capacitive touch switch and control device in accordance with a first preferred embodiment of the present invention.

FIG. 1 is a schematic diagram of a capacitive touch switch and control device in accordance with a first preferred embodiment of the present invention. The capacitive touch switch and control device includes a capacitive sensor element S that changes capacitance when touched. The capacitive sensor element S, when touched, forms a capacitance Ct with a user who touches it. Here, it shall be expressly pointed out that the present invention is not to be restricted to any special type or configuration of the capacitive sensor element S. A capacitor C is connected in parallel with the capacitive sensor elements S to define a parallel circuit. A capacitance/frequency converter 2 has an input terminal connected to the parallel circuit and an output terminal connected to the parallel circuit via a resistor R. The output terminal of the capacitance/frequency converter 2 is also connected to a microprocessor 3. An antenna 1 is connected to the microprocessor 3 and includes a positive branch (not labeled) and a negative branch (not labeled). The positive branch and the negative branch synchronously and correspondingly receive a pair of signals from the microprocessor 3. The pair of signals each undergoes a 180-degree phase shift relative to the each other and are correspondingly transmitted to the positive branch and the negative branch, thus, shielding noises from the environment of the capacitive sensor element S.

The capacitance/frequency converter 2 generates and outputs a frequency signal representing a frequency that reflects a total capacitance at the input terminal of the capacitance/frequency converter 2. If the capacitive sensor element S is not touched, the total capacitance at the input terminal of the capacitance/frequency converter 2 is contributed by the capacitor C. The capacitance/frequency converter 2 outputs a particular frequency signal representing a basic frequency f0 to the microprocessor 3. If the capacitive sensor element S is touched, the total capacitance at the input terminal of the capacitance/frequency converter 2 includes a capacitance of the capacitor C and the capacitance Ct generated when touched. The capacitance/frequency converter 2 outputs a frequency signal representing a frequency different from the basic frequency f0.

The microprocessor 3 receives the frequency signal from the capacitance/frequency converter 2, and looks up a look-up table stored therein to output a control signal to an electronic device 4, thus triggering operations of playing, pause, shutdown, and the like.

Figure 2:
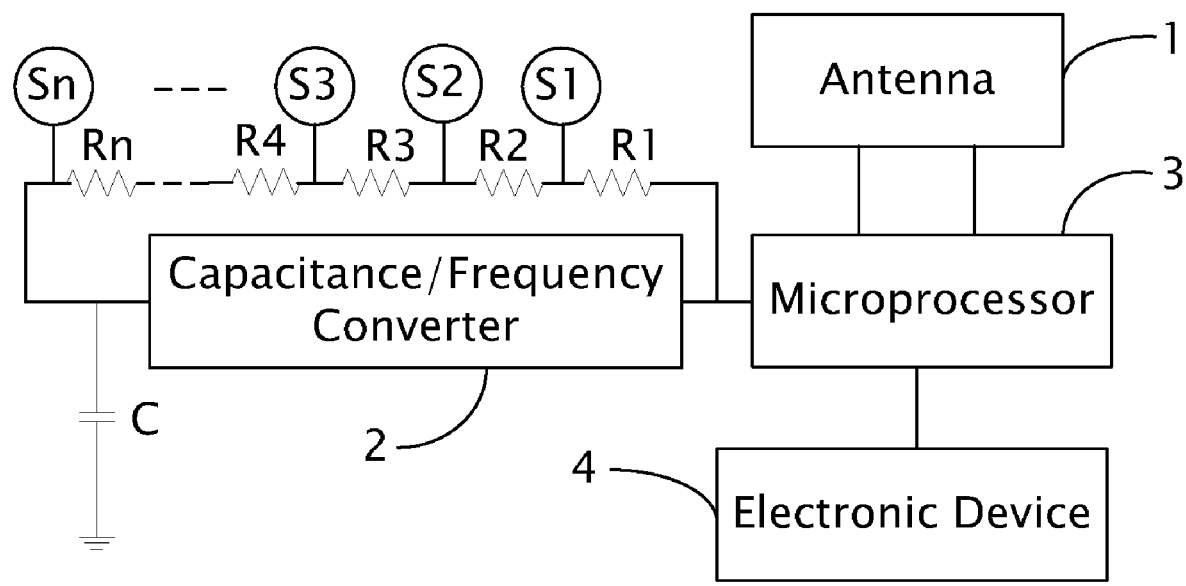
FIG. 2 is a schematic diagram of the capacitive touch switch and control device in accordance with a second preferred embodiment of the present invention.

Refer to FIG. 2, FIG. 2 is a schematic diagram of the capacitive touch switch and control device in accordance with a second preferred embodiment of the present invention. In the second preferred embodiment, the capacitive touch switch and control device includes a plurality of capacitive sensor elements S1, S2, S3, Sn and resistors R1, R2, R3, . . . , Rn. FIG. 3 shows a frequency-control signal look-up table that records corresponding relationships between a plurality of predetermined frequency values and a plurality of control signals. The capacitive sensor elements S1, S2, S3, ..., Sn have same properties and generate a same capacitance value Ct when touched correspondingly. The plurality of resistors R1, R2, R3, R4, ..., Rn are connected in series between the input terminal and the output terminal of the capacitance/frequency converter 2. The capacitor C is connected in parallel with the capacitive sensor element Sn forming a parallel circuit. The capacitive sensor elements S1, S2, S3, ..., Sn are separated from each other by the resistors R2, R3, R4, ..., Rn correspondingly. Particularly, the capacitive sensor element S1 is connected with a node between the resistor R1 and the resistor R2; the capacitive sensor element S2 is connected with a node between the resistor R2 and the resistor R3; the capacitive sensor element S3 is connected with a node between the resistor R3 and the resistor R4, and so on.

If the plurality of capacitive sensor elements S1, S2, S3, ..., Sn are not touched, the total capacitance at the input terminal of the capacitance/frequency converter 2 is contributed by the capacitor C. An output of the capacitance/frequency converter 2 is fed back to the input terminal of the capacitance/frequency converter 2 via the resistors R1, R2, R3, ..., Rn, and a total feedback resistance at the capacitance/frequency converter 2 is a sum of resistances of the resistors R1, R2, R3, ..., Rn. Based on the total capacitance and the total feedback resistance, the capacitance/frequency converter 2 outputs a particular frequency signal representing a basic frequency f0.

If any of the capacitive sensor elements S1, S2, S3, ..., Sn are touched, the total capacitance at the input terminal of the capacitance/frequency converter 2 includes the capacitance of the capacitor C and the capacitance Ct generated during the touch. At the same time, the total feedback resistance at the input of the capacitance/frequency converter 2 is determined in accordance with which of the capacitive sensor element S1, S2, S3, ..., Sn is touched. The changes of the total capacitance and the total feedback resistance at the input terminal of the capacitance/frequency converter 2 change the outputted frequency signal of the capacitance/frequency converter 2.

Particularly, when the capacitive sensor element S1 is touched, the total capacitance at the input terminal of the capacitance/frequency converter 2 includes the capacitance of the capacitor C and the capacitance Ct generated during the capacitive sensor element S1 be touched, and the total feedback resistance at the capacitance/frequency converter 2 is a resistance of the resistor R1 because the output of the capacitance/frequency converter 2 is fed back only via the feedback resistor R1. The capacitance/frequency converter 2 accordingly outputs a frequency signal representing a frequency f1. If the capacitive sensor element S2 is touched, the total capacitance at the input of the capacitance/frequency converter 2 includes the capacitance of the capacitor C and the capacitance Ct generated during the capacitive sensor element S2 be touched, the output of the capacitance/frequency converter 2 is fed back via the resistors R1, R2, the capacitance/frequency converter 2 accordingly outputs a frequency signal representing a frequency f2. when the capacitive sensor element S3 is touched, the total capacitance at the input of the capacitance/frequency converter 2 includes the capacitance of the capacitor C and the capacitance Ct generated during the capacitive sensor element S3 be touched, and the total feedback resistance is a sum of resistance of the resistors R1, R2, R3 since the output of the capacitance/frequency converter 2 is fed back via the resistors R1, R2, R3. The capacitance/frequency converter 2 accordingly outputs a frequency signal representing a frequency f3. In the same way, when the capacitive sensor element Sn is touched, the total capacitance at the input of the capacitance/frequency converter 2 includes the capacitance of the capacitor C and the capacitance Ct generated during the capacitive sensor element Sn be touched, and the total feedback resistance is a sum of resistance of the resistors R1, R2, R3, ..., Rn since the output of the capacitance/frequency converter 2 is fed back via the resistors R1, R2, R3, ..., Rn. The capacitance/frequency converter 2 outputs a frequency signal representing a frequency fn.

Refer to FIG. 3, FIG. 3 shows a frequency-control signal look-up table that defines corresponding relationships between a plurality of predetermined frequency values and a plurality of control signals. The microprocessor 3 receives the frequency signals outputted by the capacitance/frequency converter 2, and looks up the look up table, thus outputting control signals to an electronic device to trigger corresponding operations. For example, if the microprocessor 3 receives the frequency signal representing the frequency f1, the microprocessor 3 determines that the frequency f1 corresponds to the predetermined frequency value F1 recorded in the look-up table and outputs a control signal X1 that corresponds to the predetermined frequency value F1 according to the look-up table. If the microprocessor 3 receives the frequency signal representing the frequency f2, the microprocessor 3 determines that the frequency f2 is coincident with a predetermined frequency value F2 recorded in the look-up table and outputs a control signal X2 that corresponds to the predetermined frequency value F2 according to the look-up table. If the microprocessor 3 receives the frequency signal representing the frequency f3, the microprocessor 3 determines that the frequency f3 is coincident with a predetermined frequency value F3 recorded in the look-up table and outputs a control signal X3 that corresponds to the predetermined frequency value F3 according to the look-up table. In the same way, if the microprocessor 3 determines that the frequency signal representing the frequency fn is coincident with a predetermined frequency value Fn and outputs a control signal Xn that corresponds to the predetermined frequency value Fn according to the look-up table. The control signals X1, X2, X3, ... Xn are outputted to the electronic device 4 to trigger corresponding operations of the electronic device.

Figure 4:
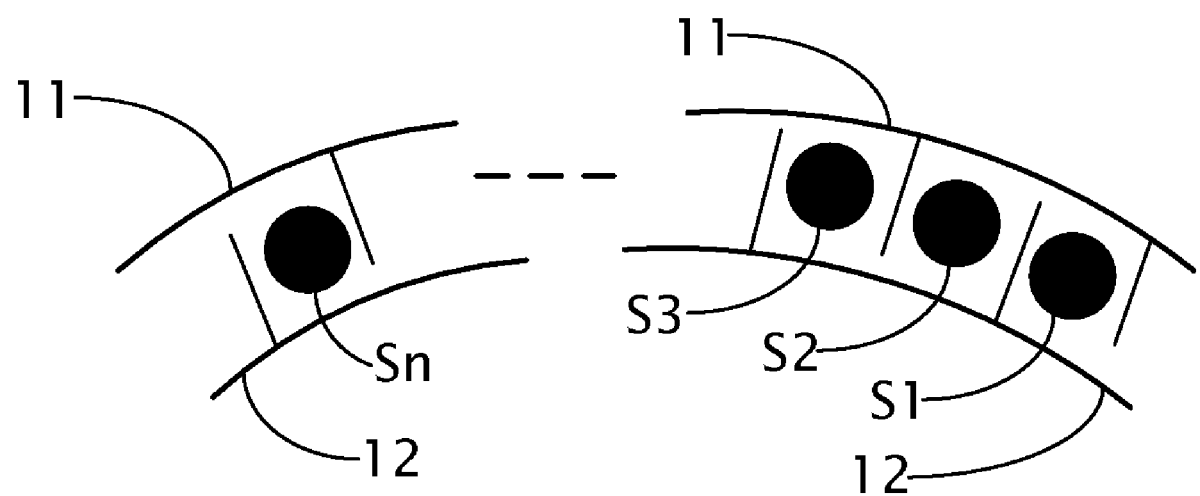
FIG. 4 shows an arrangement of capacitive sensor elements and antennas of the capacitive touch switch and control device on a print circuit board.
Figure 5:
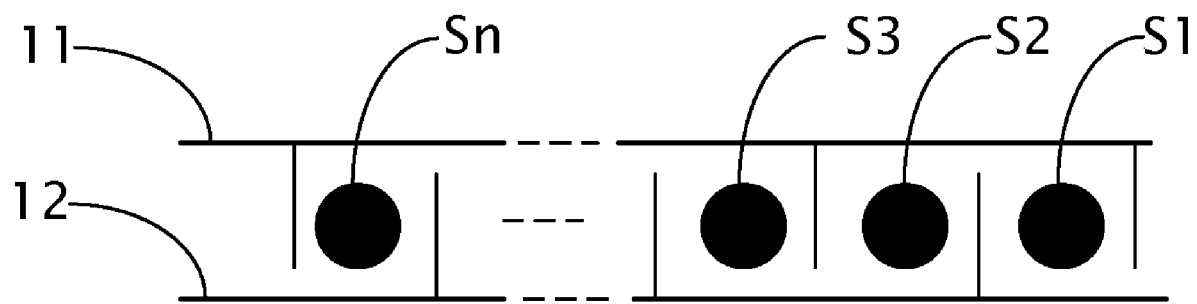
FIG. 5 shows another arrangement of the capacitive sensor elements and the antennas on the print circuit board.

Referring to FIGS. 4 and 5. FIG. 4 shows an arrangement of the capacitive sensor elements S1, S2, S3, ..., Sn and the antenna 1 on a print circuit board. FIG. 5 shows another arrangement of the capacitive sensor elements S1, S2, S3, ..., Sn and the antenna 1 on the print circuit board. The capacitive sensor elements S1, S2, S3, ..., Sn are printed on the print circuit board in a suitable way for operating the electronic device 4. The antenna 1 includes the negative branch 11 and a plurality of branches and the positive branch 12 and a plurality of branches which symmetrically surround the capacitive sensor elements S1, S2, S3, ..., Sn. The positive branch 12 and the negative branch 11 synchronously and correspondingly receive a pair of signals from the microprocessor 3. The pair of signals each undergoes a 180-degree phase shift relative to the each other and are correspondingly transmitted to the positive branch 12 and the negative branch 11, thereby shielding noises from the environment of the capacitive sensor element S.

Based on the preferred embodiments disclosed above, an advantage of the present invention over the prior art obviously comes up. The advantage is that the capacitive touch switch and control device can be implemented in a simple manner, moreover, can shield noise that the environment acts on the capacitive sensor elements.

Although the present invention has been specifically described on the basis of a preferred embodiment and method thereof, the invention is not to be construed as being limited thereto. Various changes or modifications may be made to the embodiments without departing from the scope and spirit of the invention.

What is claimed is:

1. A capacitive touch switch and control device comprising:
   a capacitive sensor element for changing its capacitance when touched;
   a capacitor connectable in parallel with the capacitive sensor element;
   a capacitance/frequency converter has an input terminal and an output terminal, the input terminal connectable with a resistor and the capacitor, the output terminal is fed back to the input terminal via the resistor;
   a microprocessor connectable with the capacitance/frequency converter for processing a frequency signal outputted by the capacitance/frequency converter and outputting a corresponding control signal corresponds to the frequency signal to trigger a corresponding function of an electronic device; and
   an antenna for receiving a pair of signals outputted by a microprocessor, the pair of signals each undergoes a 180-degree phase shift relative to each other and are correspondingly transmitted to the positive branch and the negative branch, thus shielding noises from the environment of the capacitive sensor element S.

2. The capacitive touch switch and control device as claimed in claim 1, wherein the antenna comprising a positive branch and a negative branch surrounding the capacitive sensor element symmetrically on a print circuit board.

3. A capacitive touch switch and control device, comprising:
   a capacitance/frequency converter having an input terminal and an output terminal, for outputting a corresponding frequency signal in accordance with a total capacitance and a total feedback resistance at the input terminal of the capacitance/frequency converter;
   a plurality of capacitive sensor elements changing their capacitances when touched;
   a capacitor for connecting with the input terminal of the capacitance/frequency converter;
   a plurality of resistors connected in series between the input terminal and the output terminal of the capacitance/frequency converter;
   a microprocessor for processing the frequency signal outputted by the capacitance/frequency converter and outputting a corresponding control signal to an electronic device to trigger a corresponding operation of the electronic device; and
   an antenna connectable with the microprocessor for receiving a pair of signals outputted by the microprocessor, the pair of signals each undergoing a 180 degree phase shift relative to each other, for shielding the noise acted on the capacitive sensor elements.

4. The capacitive touch switch and control device as claimed in claim 3, wherein the microprocessor further storing a frequency value-control signal look-up table, the table defining a corresponding relationships between a plurality of predetermined frequency values and a plurality of control signals.

5. The capacitive touch switch and control device as claimed in claim 3, wherein the antenna comprises a plurality of branches.

6. The capacitive touch switch and control device as claimed in claim 5, wherein the antenna comprises a positive branch and a negative branch surrounding the capacitive sensor elements symmetrically on the print circuit board.

7. The capacitive touch switch and control device as claimed in claim 3, wherein the total feedback resistance at the input of the capacitance/frequency converter is determined in accordance with which of the plurality of capacitive sensor elements is touched respectively.

8. The capacitive touch switch and control device as claimed in claim 7, wherein if any of the plurality of capacitive sensor elements is touched, the total capacitance at the input terminal of the capacitance/frequency converter includes the capacitance of the capacitor C and the capacitance value generated by the capacitive sensor element.

9. The capacitive touch switch and control device as claimed in claim 8, wherein the change in the total capacitance and the total feedback resistance at the input terminal of the capacitance/frequency converter 2 changes the output frequency of the capacitance/frequency converter 2.

* * * * *